United States Patent
Urgen et al.

(10) Patent No.: US 11,320,174 B2
(45) Date of Patent: May 3, 2022

(54) SOLAR SELECTIVE COATING FOR MID-HIGH TEMPERATURE SOLAR THERMAL APPLICATIONS

(71) Applicant: B-PLAS BURSA PLASTIK, METAL, INSAAT, ENERJI, MADENCILIK, JEOTERMAL, TURIZM, SIVIL HAVACILIK VE TARIM SAN. VE TIC. A.S., Bursa (TR)

(72) Inventors: Mustafa K. Urgen, Istanbul (TR); M. Kursat Kazmanli, Istanbul (TR); M. Celal Gokcen, Bursa (TR); Eren Seckin, Istanbul (TR); Serdar S. Ozbay, Istanbul (TR)

(73) Assignee: B-PLAS-BURSA PLASTIK, METAL, INSAAT, ENERJI, MADENCILIK, JEOTERMAL, TURIZM, SIVIL HAVACILIK VE TARIM, SAN. VE TIC. A.S., Bursa (TR)

(*) Notice: Subject to any disclaimer, the term of this patent is extended or adjusted under 35 U.S.C. 154(b) by 0 days.

(21) Appl. No.: 17/040,613

(22) PCT Filed: May 9, 2018

(86) PCT No.: PCT/EP2018/062092
§ 371 (c)(1),
(2) Date: Sep. 23, 2020

(87) PCT Pub. No.: WO2019/214820
PCT Pub. Date: Nov. 14, 2019

(65) Prior Publication Data
US 2021/0048228 A1    Feb. 18, 2021

(51) Int. Cl.
| F24S 70/225 | (2018.01) |
| F24S 70/25 | (2018.01) |
| C23C 14/00 | (2006.01) |
| C23C 14/06 | (2006.01) |
| C23C 14/35 | (2006.01) |

(52) U.S. Cl.
CPC ........ *F24S 70/225* (2018.05); *C23C 14/0036* (2013.01); *C23C 14/0617* (2013.01); *C23C 14/0641* (2013.01); *C23C 14/352* (2013.01); *F24S 70/25* (2018.05)

(58) Field of Classification Search
None
See application file for complete search history.

(56) References Cited

U.S. PATENT DOCUMENTS

| 2016/0010896 A1* | 1/2016 | Chandra ............... C23C 28/321 |
| | | 428/446 |
| 2016/0040912 A1 | 2/2016 | Chandra |

FOREIGN PATENT DOCUMENTS

| CN | 106702331 | 5/2017 |
| DE | 102006039669 | 2/2008 |
| DE | 102012014675 | 2/2013 |
| WO | WO 2005010225 | 2/2005 |
| WO | WO 2011135152 | 11/2011 |
| WO | WO 2014122667 | 8/2014 |
| WO | WO 2017134589 | 8/2017 |

OTHER PUBLICATIONS

PCT/EP2018/062092 International Search Report, dated Nov. 3, 2019. 4 pages.
PCT/EP2018/062092 Written Opinion, dated Nov. 3, 2019. 5 pages.

* cited by examiner

*Primary Examiner* — Jason Lau
(74) *Attorney, Agent, or Firm* — Joseph E. Maenner; Maenner & Associates, LLC

(57) ABSTRACT

The present invention relates to a solar selective coating for a metal substrate comprising at least one absorber layer and at least one semi-absorber layer selected from the structures of AlTiN and AlTiSiN. In preferred embodiments, the solar selective coating according to the present invention is a double layer coating with AlTiN—AlTiN or AlTiSiN—AlTiSiN formation. The process for producing the coating includes a step of treatment of the metal substrate with a reactive magnetron sputtering system.

6 Claims, No Drawings

SOLAR SELECTIVE COATING FOR MID-HIGH TEMPERATURE SOLAR THERMAL APPLICATIONS

CROSS-REFERENCE TO RELATED APPLICATION

The present application is a 371 of Patent Cooperation Treaty application PCT/EP2018/062092, filed on May 9, 2018, which is incorporated herein by reference in its entirety.

TECHNICAL FIELD

The present invention relates to an improved coating and a method for the preparation thereof for application in solar selective coatings. More particularly, the invention relates to mid-high temperature solar selective coatings for applications on metal substrates, which coatings are highly stable, durable, cost effective, and efficient in terms of absorptance and emittance.

BACKGROUND OF THE INVENTION

Providing improved coatings on metal substrates such as solar collectors is currently an important focus in the field of solar energy. There have been various attempts and methods suggested for producing said coatings in order to meet the requirements of the industry. It is particularly important in the solar energy field to provide coatings which provide the desired efficiency in terms of absorptance and emittance in a cost effective manner. It is also desirable that the coating should be stable and durable enough against the physical conditions in a broad range of temperatures.

WO 2014/122667 A1, for instance, discloses a hybrid multilayer solar selective coating comprising a stack of layers containing Ti/chrome interlayer, first absorber layer of aluminum titanium nitride (AlTiN), second absorber layer of aluminum titanium oxynitride (AlTiON), an antireflection layer of aluminum titanium oxide (AlTiO) and a barrier layer of an organically modified silica (ormosil).

WO 2005/010225 A1 suggests various layered materials including TiN/AlN or TiAlN/AlN composite layers as an absorber layer, and AlN as a semi-absorber layer.

DE 102006039669 A1 discloses a solar selective coating comprising TiAlN/TiAlON/$Si_3N_4$ on a substrate such as copper, nickel, stainless steel, glass or nimonic, which has been prepared via DC magnetron sputtering. Likewise, DE 102012014675 A1 discloses a multilayer coating comprising TiAlN or AlTiN along with an absorption layer of silicon nitride ($Si_3N_4$).

Although there has been various attempts to improve the solar coatings as outlined above, there is still a long felt need for simplifying the conventional production techniques without sacrifizing stability and efficiency of the coating.

SUMMARY OF THE INVENTION

A main objective of embodiments of the present invention is thus to provide a solar selective coating on metal substrates with ease of producibility and efficiency in terms of absorptance and emittance.

Another objective of the current invention is to provide a solar selective coating on metallic substrates with high thermal stability.

Still another object of the present invention is to provide a solar selective coating on metallic substrates which has high solar selectivity.

Still a further object of the present invention is to provide a solar selective coating on metallic substrates which has higher durability and resistance to corrosion.

It is therefore preferable in the context of the present invention to obtain a solar selective coating with an absorptance of >0.97. It is also aimed to obtain a solar selective coating on a metal substrate which has a thermal stability in vacuum up to 900° C., and in air up to 650° C.

These and other objectives of the present invention have been achieved through a solar selective coating for a metal substrate comprising at least one absorber layer and at least one semi-absorber layer selected from the structures of AlTiN and AlTiSiN, wherein:
the composition of the absorber layer is essentially limited with the following components;
    Al; 25-40 at. %,
    Ti; 15-40 at. %,
    N; 20-45 at. %, and
    Si; 0.5-5 at. %, if AlTiSiN is used in the absorber layer,
and the composition of the semi-absorber layer is essentially limited with the following components;
    Al; 20-35 at. %,
    Ti; 1-15 at. %,
    N; 40-80 at. %,
    Si; 0.5-5 at. %, if AlTiSiN is used in the semi-absorber layer.

In one of the most preferred embodiments, the solar selective coating is a double layer coating with AlTiN—AlTiN formation comprising;

| AlTiN - AlTiN double layer coating | | |
|---|---|---|
| | AlTiN Absorber Layer (at. %) | AlTiN Semi-Absorber Layer (at. %) |
| Al | 36.22 | 29.84 |
| Ti | 25.64 | 7.72 |
| N | 38.14 | 63.09 |

In the most preferred embodiment, the solar selective coating is a double layer coating with AlTiSiN—AlTiSiN formation comprising;

| AlTiSiN - AlTiSiN double layer coating | | |
|---|---|---|
| | AlTiSiN Absorber Layer (at. %) | AlTiSiN Semi-Absorber Layer (at. %) |
| Al | 35.51 | 29.84 |
| Ti | 24.78 | 7.72 |
| Si | 2.01 | 1.84 |
| N | 37.70 | 63.09 |

In another aspect, the present invention relates to a process for producing a solar selective coating, comprising the steps:
placing a metal substrate into a reactive magnetron sputtering system and creating vacuum,
depositing an absorber layer comprising a formation of AlTiN or AlTiSiN as explained above,
depositing a semi-absorber layer comprising a formation of AlTiN or AlTiSiN as explained above, and
obtaining a coating having said absorber layer and semi-absorber layer.

Deposition of the layers on the metal substrate is carried out preferably using a DC power supply in a power density range of 4-7 W/cm². The deposition may be carried out at a substrate temperature of 50-150° C. It is also preferable that reactive magnetron sputtering is carried out with an Ar—N₂ gas mixture wherein flow rate of Ar is inbetween 80-120 sccm and flow rate of N₂ is inbetween 40-90 sccm. In this process, the thickness of the absorber layer is arranged inbetween 50-70 nm and the thickness of the semi-absorber layer is arranged inbetween 60-80 nm. The metal substrate in the context of the present invention is selected from stainless steel and copper.

In another aspect, the present invention pertains to a metal structure comprising a coating as defined above. The metal is preferably selected from stainless steel and copper. The metal structure may for instance be a solar collector.

DETAILED DESCRIPTION OF THE INVENTION

The present invention provides a novel coating comprising basically a main absorber layer, and a semi-absorber layer which in turn behaves also as an anti-reflection layer. Both of these layers fundamentally comprise individually designed coating layers in the form of AlTiN or AlTiSiN which can be selected depending on the desired characteristics of the coating.

Hence, the embodiments of the current invention provide coatings on metal substrates comprising a main absorber layer and a semi-absorber layer in the form of one of the configurations hereinbelow:

AlTiN—AlTiN
AlTiN—AlTiSiN
AlTiSiN—AlTiN
AlTiSiN—AlTiSiN

Hence the present invention provides selective solar coatings selected from AlTiN and AlTiSiN with different elemental ratios. In preferred embodiments, however, main absorber layer and the semi-absorber layer selected with a configuration such that AlTiN—AlTiN and AlTiSiN—AlTiSiN. In most preferred embodiment, the desired configuration involves AlTiSiN—AlTiSiN.

Accordingly, the main absorber layer of the present invention can be selected from AlTiN and AlTiSiN, wherein the composition of the coating is essentially limited with the following components;
Al; 25-40 at. %,
Ti; 15-40 at. %,
N; 20-45 at. %,
Si; 0.5-5 at. % (if AlTiSiN is used in the main absorber layer).

Likewise, the semi-absorber layer of the current invention can be selected from AlTiN and AlTiSiN, wherein the composition of the coating is essentially limited with the following components;
Al; 20-35 at. %,
Ti; 1-15 at. %,
N; 40-80 at. %,
Si; 0.5-5 at. % (if AlTiSiN is used in the semi-absorber layer).

The coating of the present invention is preferably a double layer coating having the main absorber layer and semi-absorber layer as identified above without a further absorber or semi-absorber layer.

In more preferred embodiments, the main absorber layer and the semi-absorber layer may comprise AlTiN or AlTiSiN with the following compositions:

| | AlTiN Main Absorber Layer (at. %) | AlTiSiN Main Absorber Layer (at. %) |
|---|---|---|
| Al | 34-38 | 33-37 |
| Ti | 23-27 | 22-26 |
| Si | — | 0.5-4 |
| N | 36-40 | 35-39 |

| | AlTiN Semi-Absorber Layer (at. %) | AlTiSiN Semi-Absorber Layer (at. %) |
|---|---|---|
| Al | 27-31 | 26-30 |
| Ti | 5-9 | 4-8 |
| Si | — | 0.5-4 |
| N | 60-64 | 61-65 |

The metal substrate on which the coating layers are applied, in the context of the present invention, can be selected from copper and stainless steel. A metal substrate made of stainless steel is particularly preferred.

In another aspect, the present invention provides a novel process for producing a solar selective coating as defined above, comprising deposition of the layers onto a metal substrate via reactive magnetron sputtering. Accordingly, the process of the present invention for producing a solar selective coating on a metal substrate comprises the steps of:

placing a metal substrate into a reactive magnetron sputtering system and creating vacuum, depositing a main absorber layer comprising AlTiN or AlTiSiN, wherein the composition of this layer is as identified above, depositing a semi-absorber layer comprising AlTiN or AlTiSiN, wherein the composition of this layer is as identified above, and obtaining a coating with the said main absorber layer and semi-absorber layer.

The reactive magnetron sputtering system may comprise 99.95-99.99% pure Al, Ti, Al—Si(95-5), Ti—Si(95-5) targets and Ar—N₂ gas mixture. Accordingly, the sputtering system may include two magnetron cathodes and power supplies, diffusion pumps, vacuum gauges and a control panel. The dimensions for each cathode may for instance be 1000×12 mm. All layers can be deposited using DC power supplies with power densities in the range of 4-7 W/cm². During the deposition, substrate temperature can be kept in a range of 50-150° C.

Before application of the magnetron sputtering, the metal substrates can be polished to remove impurities and reduce surface roughness. The polished samples can be cleaned using ethyl alcohol and acetone. Then, cleaned samples are placed in magnetron sputtering system and chamber was pumped down to a base pressure such as 1×10⁻³ Pa. Absorber and semi absorber layers are deposited on the substrates in Ar+N₂ gas mixture.

In another aspect, the present invention pertains to a structure comprising a metal substrate having the coating as identified herein. Said article is preferably a solar collector.

The examples hereinbelow are given for better understanding of the current invention which are however not limiting the scope of the claims in anyway.

EXAMPLES

In the following Examples, stainless steel and copper substrates were coated with double layer coatings of AlTiN—AlTiN and AlTiSiN—AlTiSiN. The atomic compositions of the coatings in Examples 4-19 were arranged as shown below:

| AlTiN - AlTiN double layer coating | | |
|---|---|---|
| | AlTiN Absorber Layer (at. %) | AlTiN Semi-Absorber Layer (at. %) |
| Al | 36.22 | 29.84 |
| Ti | 25.64 | 7.72 |
| N | 38.14 | 63.09 |

| AlTiSiN - AlTiSiN double layer coating | | |
|---|---|---|
| | AlTiSiN Absorber Layer (at. %) | AlTiSiN Semi-Absorber Layer (at. %) |
| Al | 35.51 | 29.84 |
| Ti | 24.78 | 7.72 |
| Si | 2.01 | 1.84 |
| N | 37.70 | 63.09 |

Example 1

Deposition of AlTiN—AlTiN Solar Selective Coating on Stainless Steel

In order to investigate the effect of nitrogen content in first AlTiN layer on optical properties of the absorber coating, metal sample was coated with metallic Al—Ti coating. Absorber layer was deposited using Al and Ti cathodes. The flow rates of Ar and $N_2$ were 100 sccm and 0 sccm. AlTiN semi-absorber layer was deposited using Al and Ti cathodes. Flow rates of Ar and $N_2$ were 100 sccm and 75 sccm, respectively. For absorber layer, power density of Al was 4.15 W/cm$^2$ and Ti cathode was 6.65 W/cm$^2$. For semi-absorber layer, power density of Al cathode was 7 W/cm$^2$ and Ti cathode was 4.15 W/cm$^2$. Deposition time for absorber and semi-absorber layers was 48 seconds and 72 seconds, respectively. The absorptance value of the coating was 0.88167 and emittance value was 0.13.

Example 2

Deposition of AlTiN Solar Selective Coating on Stainless Steel (Without Second Layer)

In order to investigate importance of second semi-absorber layer, the first layer was coated on stainless steel substrates and optical properties have been characterized. Stainless steel substrates of the dimension 50×50 mm were polished and cleaned using acetone and ethyl alcohol. The substrates were polished to remove impurities and reduce surface roughness. The polished samples were cleaned using ethyl alcohol and acetone. Then, cleaned samples were placed in magnetron sputtering system and chamber was pumped down to a base pressure of $1\times10^{-3}$ Pa. Absorber layer was deposited using Al and Ti cathodes. The flow rates of Ar and $N_2$ were 100 sccm and 50 sccm, respectively. For absorber layer, power density of Al was 4.15 W/cm$^2$ and Ti cathode was 6.65 W/cm$^2$. Deposition time for absorber layers was 48 seconds. The absorptance value of the coating was 0.87541 and emittance value was 0.12.

Example 3

Thickness Dependence of AlTiN—AlTiN Solar Selective Coating on Stainless Steel

In order to investigate thickness dependence of optical properties of semi-absorber layer, the second layer was coated with different thicknesses on the first absorber layer. Stainless steel substrates of the dimension 50×50 mm were polished and cleaned using acetone and ethyl alcohol. The substrates were polished to remove impurities and reduce surface roughness. The polished samples were cleaned using ethyl alcohol and acetone. Then, cleaned samples were placed in magnetron sputtering system and chamber was pumped down to base pressure of $1\times10^{-3}$ Pa. Absorber and semi-absorber layers were deposited using Al and Ti cathodes. During the deposition of absorber layer, the flow rates of Ar and $N_2$ were 100 sccm and 50 sccm, respectively. For absorber layer, power density of Al was 4.15 W/cm$^2$ and Ti cathode was 6.65 W/cm$^2$. For semi-absorber layer, flow rates of Ar and $N_2$ were 100 sccm and 75 sccm, respectively. Power density of Al cathode was 7 W/cm$^2$ and Ti cathode was 4.15 W/cm$^2$. Deposition times for semi-absorber layer were 63, 72, and 81 seconds. The absorptance values of the coatings were 0.94254, 0.97553 and 0.95722, respectively. The emittance values of the coatings were 0.16.

Example 4

Deposition of AlTiN—AlTiN Solar Selective Coating on Stainless Steel

Stainless steel substrates of the dimension 50×50 mm were polished and cleaned using acetone and ethyl alcohol. The substrates were polished to remove impurities and reduce surface roughness. The polished samples were cleaned using ethyl alcohol and acetone. Then, cleaned samples were placed in magnetron sputtering system and chamber was pumped down to base pressure of $1\times10^{-3}$ Pa. Absorber and semi absorber layers were deposited on substrates in Ar+$N_2$ gas mixture. The absorber coating was deposited using Al and Ti cathodes. The flow rates of Ar and $N_2$ were 100 sccm and 50 sccm, respectively, for AlTiN absorber coatings. AlTiN semi-absorber layer was deposited using Al and Ti cathodes. Flow rates of Ar and $N_2$ were 100 sccm and 75 sccm, respectively. For absorber layer, power density of Al was 4.15 W/cm$^2$ and Ti cathode was 6.65 W/cm$^2$. For semi-absorber layer, power density of Al cathode was 7 W/cm$^2$ and Ti cathode was 4.15 W/cm$^2$. Deposition times for absorber and semi-absorber layers were 48 and 72 seconds, respectively. Layer thicknesses were 60 nm and 70 nm, respectively.

Example 5

Deposition of AlTiSiN—AlTiSiN Solar Selective Coating on Stainless Steel and Copper Stainless steel and copper substrates of the dimension 50×50 mm were polished and cleaned using acetone and ethyl alcohol. The substrates were polished to remove impurities and reduce surface roughness. The polished samples were cleaned using ethyl alcohol and acetone. Then, cleaned samples were placed in magnetron sputtering system and chamber was pumped down to a base pressure of $1\times10^{-3}$ Pa. Absorber and semi absorber layers were deposited on substrates in Ar+$N_2$ gas mixture. The absorber coating was deposited using Al and Ti cathodes. The flow rates of Ar and $N_2$ were 100 sccm and 50 sccm, respectively, for AlTiSiN absorber coatings. AlTiSiN semi-absorber layer was deposited using Al—Si(95-5) and Ti—Si(95-5) cathodes. Flow rates of Ar and $N_2$ were 100 sccm and 75 sccm, respectively. For absorber layer, power density of Al—Si(95-5) was 4.15 W/cm$^2$ and Ti—Si(95-5) cathode was 6.65 W/cm$^2$. For semi-absorber layer, power density of Al—Si(95-5) cathode was 7 W/cm$^2$ and Ti-(95-5) cathode was 4.15 W/cm$^2$. Deposition times for absorber and semi-absorber layers were 48 and 72 seconds, respectively. Layer thicknesses were 60 nm and 70 nm, respectively.

Example 6

Thermal Stability of AlTiN—AlTiN Solar Selective Coating (in Air) on Stainless Steel Substrate

TABLE 1

| Temperature (° C.) | Duration (h) | Absorptance ($\alpha$) | | Emittance ($\varepsilon$) | |
|---|---|---|---|---|---|
| | | As deposited | Annealed | As deposited | Annealed |
| 200 | 2 | 0.97557 | 0.97910 | 0.16 | 0.16 |
| 300 | 2 | | 0.97027 | | 0.16 |
| 400 | 2 | | 0.97602 | | 0.15 |
| 450 | 2 | | 0.98089 | | 0.15 |
| 500 | 2 | | 0.96625 | | 0.14 |
| 550 | 2 | | 0.96626 | | 0.14 |
| 600 | 2 | | 0.93101 | | 0.13 |
| 650 | 2 | | 0.93301 | | 0.12 |
| 700 | 2 | | 0.92242 | | 0.12 |
| 750 | 2 | | 0.91733 | | 0.12 |

The coating in Example 4 was heated in air for 2 hours at different temperatures. The heating and cooling rates were 10° C./min and 1° C./min, respectively. Absorptance and emittance values of before and after heat treatment are presented in Table 1 for AlTiN—AlTiN double layer coating.

Example 7

Thermal Stability of AlTiSiN—AlTiSiN Solar Selective Coating (in Air) on Stainless Steel Substrate

TABLE 2

| Temperature (° C.) | Duration (h) | Absorptance ($\alpha$) | | Emittance ($\varepsilon$) | |
|---|---|---|---|---|---|
| | | As deposited | Annealed | As deposited | Annealed |
| 200 | 2 | 0.97663 | 0.97822 | 0.16 | 0.16 |
| 300 | 2 | | 0.97312 | | 0.16 |
| 400 | 2 | | 0.97209 | | 0.15 |
| 450 | 2 | | 0.97441 | | 0.15 |
| 500 | 2 | | 0.97546 | | 0.14 |
| 550 | 2 | | 0.96407 | | 0.14 |
| 600 | 2 | | 0.94093 | | 0.13 |
| 650 | 2 | | 0.93129 | | 0.12 |
| 700 | 2 | | 0.93401 | | 0.12 |
| 750 | 2 | | 0.92781 | | 0.12 |

The coating in Example 5 was heated in air for 2 hours at different temperatures. The heating and cooling rates were 10° C./min and 1° C./min, respectively. Absorptance and emittance values of before and after heat treatment are presented in Table 2 for AlTiSiN—AlTiSiN double layer coating.

Example 8

Thermal Stability of AlTiN—AlTiN Solar Selective Coating (in Vacuum) on Stainless Steel Substrate

TABLE 3

| Temperature (° C.) | Duration (h) | Absorptance ($\alpha$) | | Emittance ($\varepsilon$) | |
|---|---|---|---|---|---|
| | | As deposited | Annealed | As deposited | Annealed |
| 600 | 3 | 0.97557 | 0.98183 | 0.16 | 0.16 |
| 700 | 3 | | 0.97378 | | 0.16 |
| 800 | 3 | | 0.97562 | | 0.16 |
| 900 | 3 | | 0.96611 | | 0.16 |

The coating in Example 4 was heated in vacuum for 3 hours at different temperatures. The heating and cooling rates were 15° C./min and 1° C./min. Absorptance and emittance values of before and after heat treatment are presented in Table 3 for AlTiN—AlTiN double layer coating. In vacuum environment, coatings remained stable up to 900° C. for 3 hours and showed increased absorptance performance due to the grain growth.

Example 9

Thermal Stability of AlTiSiN—AlTiSiN Solar Selective Coating (in Vacuum) on Stainless Steel Substrate

TABLE 4

| Temperature (° C.) | Duration (h) | Absorptance ($\alpha$) | | Emittance ($\varepsilon$) | |
|---|---|---|---|---|---|
| | | As deposited | Annealed | As deposited | Annealed |
| 600 | 3 | 0.97663 | 0.97922 | 0.16 | 0.16 |
| 700 | 3 | | 0.97472 | | 0.16 |
| 800 | 3 | | 0.97388 | | 0.16 |
| 900 | 3 | | 0.97245 | | 0.16 |

The coating in Example 5 was heated in vacuum for 3 hours duration at different temperatures. The heating and cooling rates were 15° C./min and 1° C./min. Absorptance and emittance values of before and after heat treatment are presented in Table 4 for the AlTiSiN—AlTiSiN double layer coating. In vacuum environment, coatings remained stable up to 900° C. for 3 hours and showed increased absorptance performance due to the grain growth.

Example 10

High Temperature Long-Term Thermal Stability of AlTiN—AlTiN Solar Selective Coating (in Air) on Stainless Steel Substrate

TABLE 5

| Temperature (° C.) | Duration (h) | Absorptance (α) As deposited | Annealed | Emittance (ε) As deposited | Annealed |
|---|---|---|---|---|---|
| 500 | 200 | 0.97557 | 0.92807 | 0.16 | 0.14 |
|     | 400 |         | 0.93260 |      | 0.13 |

The coating in Example 4 was heated in air for 200 and 400 hours durations at different temperatures. The heating and cooling rates were 15° C./min and 1° C./min. Absorptance and emittance values of before and after heat treatment are presented in Table 5 for the AlTiN—AlTiN double layer coating.

Example 11

High Temperature Long-Term Thermal Stability of AlTiSiN—AlTiSiN Solar Selective Coating (in Air) on Stainless Steel Substrate

TABLE 6

| Temperature (° C.) | Duration (h) | Absorptance (α) As deposited | Annealed | Emittance (ε) As deposited | Annealed |
|---|---|---|---|---|---|
| 500 | 200 | 0.97663 | 0.93543 | 0.16 | 0.14 |
|     | 400 |         | 0.93988 |      | 0.13 |

The coating in Example 5 was heated in air for 200 and 400 hours durations at different temperatures. The heating and cooling rates were 15° C./min and 1° C./min, respectively. Absorptance and emittance values of before and after heat treatment are presented in Table 6 for the AlTiSiN—AlTiSiN double layer coating.

Example 12

Low Temperature Thermal Stability of AlTiN—AlTiN Solar Selective Coating (in Air) on Stainless Steel Substrate

TABLE 7

| Temperature (° C.) | Duration (h) | Absorptance (α) As deposited | Annealed | Emittance (ε) As deposited | Annealed |
|---|---|---|---|---|---|
| 350 | 72  | 0.97557 | 0.98402 | 0.16 | 0.15 |
|     | 144 |         | 0.97885 |      | 0.14 |
|     | 216 |         | 0.97711 |      | 0.14 |
|     | 288 |         | 0.97463 |      | 0.14 |

Example 13

Low Temperature Thermal Stability of AlTiSiN—AlTiSiN Solar Selective Coating (in Air) on Stainless Steel Substrate

TABLE 8

| Temperature (° C.) | Duration (h) | Absorptance (α) As deposited | Annealed | Emittance (ε) As deposited | Annealed |
|---|---|---|---|---|---|
| 350 | 72  | 0.97663 | 0.98537 | 0.16 | 0.15 |
|     | 144 |         | 0.98172 |      | 0.14 |
|     | 216 |         | 0.97880 |      | 0.14 |
|     | 288 |         | 0.97644 |      | 0.14 |

Example 14

Corrosion Resistance of AlTiN—AlTiN Solar Selective Coating on Stainless Steel Substrate

TABLE 9

| Temperature (° C.) | Duration (h) | Absorptance (α) As deposited | Annealed | Emittance (ε) As deposited | Annealed |
|---|---|---|---|---|---|
| ASTM B117 | 96  | 0.97557 | 0.97878 | 0.16 | 0.16 |
|           | 192 |         |         |      |      |

Example 15

Environmental Test of AlTiN—AlTiN Solar Selective Coating on Stainless Steel Substrate

TABLE 10

| Temperature (° C.), Humidity | Duration (h) | Absorptance (α) As deposited | Annealed | Emittance (ε) As deposited | Annealed |
|---|---|---|---|---|---|
| 40, 95% | 80  | 0.97557 | 0.98090 | 0.16 | 0.16 |
|         | 150 |         | 0.97857 |      | 0.16 |
|         | 300 |         | 0.98219 |      | 0.16 |
|         | 600 |         | 0.97549 |      | 0.16 |

Example 16

Corrosion Resistance of AlTiSiN—AlTiSiN Solar Selective Coating on Stainless Steel Substrate

TABLE 11

| Temperature (° C.) | Duration (h) | Absorptance (α) As deposited | Absorptance (α) Annealed | Emittance (ε) As deposited | Emittance (ε) Annealed |
|---|---|---|---|---|---|
| ASTM B117 | 96 192 | 0.97663 | 0.98153 | 0.16 | 0.16 |

Example 17

Environmental Test of AlTiSiN—AlTiSiN Solar Selective Coating on Stainless Steel Substrate

TABLE 12

| Temperature (° C.), Humidity | Duration (h) | Absorptance (α) As deposited | Absorptance (α) Annealed | Emittance (ε) As deposited | Emittance (ε) Annealed |
|---|---|---|---|---|---|
| 40, 95% | 80 | 0.97663 | 0.98144 | 0.16 | 0.16 |
|  | 150 |  | 0.97912 |  | 0.16 |
|  | 300 |  | 0.97893 |  | 0.16 |
|  | 600 |  | 0.97884 |  | 0.16 |

Example 18

Thermal Stability of AlTiN—AlTiN Solar Selective Coating on Copper Substrate

TABLE 13

| Temperature (° C.) | Duration (h) | Absorptance (α) As deposited | Absorptance (α) Annealed | Emittance (ε) As deposited | Emittance (ε) Annealed |
|---|---|---|---|---|---|
| 250 | 100 | 0.97744 | 94.655 | 0.04 | 0.06 |
|  | 150 |  | 94.217 |  | 0.07 |
|  | 200 |  | 93.428 |  | 0.09 |
|  | 250 |  | 92.978 |  | 0.10 |

Example 19

Thermal Stability of AlTiSiN—AlTiSiN Solar Selective Coating on Copper Substrate

TABLE 14

| Temperature (° C.) | Duration (h) | Absorptance (α) As deposited | Absorptance (α) Annealed | Emittance (ε) As deposited | Emittance (ε) Annealed |
|---|---|---|---|---|---|
| 250 | 100 | 0.97698 | 93.587 | 0.04 | 0.06 |
|  | 150 |  | 94.132 |  | 0.08 |
|  | 200 |  | 92.842 |  | 0.08 |
|  | 250 |  | 92.502 |  | 0.11 |

The invention claimed is:

1. A solar selective coating for a metal substrate comprising at least one absorber layer and at least one semi-absorber layer, wherein the composition of the absorber layer consists essentially of the following components;

Al; 25-40 at. %,

Ti; 15-40 at. %,

N; 20-45 at. %, and

Si; 0.5-5 at. % and the composition of the semi-absorber layer consists essentially of the following components;

Al; 20-35 at. %,

Ti; 1-15 at. %,

N; 40-80 at. %,

Si; 0.5-5 at. %.

2. The solar selective coating according to claim 1 wherein the absorber layer and semi-absorber layer comprises AlTiSiN selected from the following compositions:

| AlTiSiN Main Absorber Layer (at. %) | |
|---|---|
| Al | 33-37 |
| Ti | 22-26 |
| Si | 0.5-4 |
| N | 35-39 |

| AlTiSiN Semi-Absorber Layer (at. %) | |
|---|---|
| Al | 26-30 |
| Ti | 4-8 |
| Si | 0.5-4 |
| N | 61-65. |

3. The solar selective coating according to claim 1 wherein the coating is a double layer coating with AlTiSiN—AlTiSiN formation comprising:

| AlTiSiN - AlTiSiN double layer coating | | |
|---|---|---|
|  | AlTiSiN Absorber Layer (at. %) | AlTiSiN Semi-Absorber Layer (at. %) |
| Al | 35.51 | 29.84 |
| Ti | 24.78 | 7.72 |
| Si | 2.01 | 1.84 |
| N | 37.70 | 63.09. |

4. A metal structure comprising a coating according to claim 1.

5. The metal structure according to claim 4 wherein the metal is selected from stainless steel and copper.

6. The metal structure according to claim 4 which is a solar collector.

* * * * *